(12) United States Patent
Ju et al.

(10) Patent No.: US 9,293,700 B2
(45) Date of Patent: Mar. 22, 2016

(54) NONVOLATILE MEMORY CELL AND NONVOLATILE MEMORY DEVICE INCLUDING THE SAME

(71) Applicant: Samsung Electronics Co., Ltd., Suwon-Si, Gyeonggi-Do (KR)

(72) Inventors: Hyun-Su Ju, Hwaseong-si (KR); Min-Kyu Yang, Hwaseong-si (KR); Eun-Mi Kim, Hwaseong-si (KR); Seong-Geon Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/301,845

(22) Filed: Jun. 11, 2014

(65) Prior Publication Data

US 2014/0291605 A1 Oct. 2, 2014

Related U.S. Application Data

(62) Division of application No. 13/587,375, filed on Aug. 16, 2012, now Pat. No. 8,785,899.

(30) Foreign Application Priority Data

Feb. 7, 2012 (KR) ........................ 10-2012-0012447

(51) Int. Cl.
*H01L 45/00* (2006.01)
*H01L 27/24* (2006.01)

(52) U.S. Cl.
CPC .......... *H01L 45/1253* (2013.01); *H01L 27/249* (2013.01); *H01L 45/08* (2013.01); *H01L 45/1226* (2013.01); *H01L 45/146* (2013.01)

(58) Field of Classification Search
CPC ... H01L 45/146; H01L 45/1233; H01L 45/08; H01L 27/2409; H01L 45/00; H01L 45/1253; G11C 13/0007
USPC ................... 257/2, 4, 751, E47.001, E21.521
See application file for complete search history.

(56) References Cited

U.S. PATENT DOCUMENTS

| | | | |
|---|---|---|---|
| 7,871,866 B2 | 1/2011 | Jeong et al. | |
| 2008/0048164 A1 | 2/2008 | Odagawa | |
| 2008/0090337 A1 | 4/2008 | Williams | |
| 2009/0020745 A1 | 1/2009 | Jeong et al. | |
| 2009/0272961 A1 | 11/2009 | Miller et al. | |
| 2011/0291067 A1* | 12/2011 | Brewer et al. ..................... 257/4 |
| 2012/0091421 A1 | 4/2012 | Wen et al. | |

FOREIGN PATENT DOCUMENTS

| | | | | |
|---|---|---|---|---|
| KR | 1020100104015 A | * | 9/2010 | ............ H01L 27/115 |
| KR | 101046725 B1 | | 7/2011 | |
| WO | WO-2011/000316 A1 | | 1/2011 | |

* cited by examiner

*Primary Examiner* — Chuong A Luu
*Assistant Examiner* — Rodolfo Fortich
(74) *Attorney, Agent, or Firm* — Harness, Dickey & Pierce, P.L.C.

(57) ABSTRACT

According to example embodiments, a nonvolatile memory cell includes a first electrode and a second electrode, a resistance change film between the first electrode and the second electrode, and a first barrier film contacting the second electrode. The resist change film contains oxygen ions and contacts the first electrode. The first barrier film is configured to reduce (and/or block) the outflow of the oxygen ions from the resistance change film.

14 Claims, 17 Drawing Sheets

NONVOLATILE MEMORY CELL AND NONVOLATILE MEMORY DEVICE INCLUDING THE SAME

This application is a divisional application of U.S. application Ser. No. 13/587,375, filed on Aug. 16, 2012, which claims priority under 35 U.S.C. §119 to Korean Patent Application No. 10-2012-0012447, filed on Feb. 7, 2012, in the Korean Intellectual Property Office, the disclosure of each of which is incorporated herein by reference in its entirety.

BACKGROUND

1. Technical Field

Example embodiments relate to a nonvolatile memory cell and/or a nonvolatile memory device including the same.

2. Description of the Related Art

Semiconductor memory devices may contain a semiconductor, such as Si, Ge, GaAs, or InP. Semiconductor memory devices may be classified as volatile memory devices or nonvolatile memory devices.

The volatile memory devices lose stored data when the power supply is interrupted. Examples of the volatile memory devices include static random access memory (SRAM) devices, dynamic random access memory (DRAM) devices, and synchronous dynamic random access memory (SDRAM) devices. The nonvolatile memory devices retain stored data even when the power supply is interrupted. Examples of nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, and resistive memory devices (e.g., phase-change random access memory (PRAM) devices, ferroelectric random access memory (FRAM) devices, and resistive random access memory (RRAM) devices).

SUMMARY

Example embodiments relate to a nonvolatile memory cell which can operate in a reliable manner without a selection element.

Example embodiments relate to a nonvolatile memory device which can operate in a reliable manner without having a selection element in each nonvolatile memory cell.

The above and other features will become more apparent to one of ordinary skill in the art to which example embodiments pertain by referencing the detailed description given below.

According to example embodiments, a nonvolatile memory cell includes: a first electrode and a second electrode; a resistance change film between the first electrode and the second electrode; and a first barrier film contacting the second electrode and the resistance change film. The resistance change film contains oxygen ions and contacts the first electrode. The first barrier film is configured to reduce the outflow of the oxygen ions from the resistance change film.

The first electrode may have a work function of 4.5 to 6.0 eV.

The first electrode may include at least one of Ni, Cu, Ru, W, Ir, Pt, Au, and Pd.

The first barrier film may be a high-K dielectric.

The first barrier film may include one of a silicidated high-K dielectric and a nitridated high-K dielectric.

A second barrier film may contact the first electrode and the resistance change film. The second barrier film may be configured to reduce the outflow of the oxygen ions from the resistance change film.

A material of the first barrier film may be different than a material of the second barrier film.

The material of the first barrier film may include one of AlOx, AlOxNy, SiNx, and SiOxNy. The material of the second barrier film may be a different of AlOx, AlOxNy, SiNx, and SiOxNy compared to the material of the first barrier film.

The resistance change film may be configured to be maintained in at least one of a low-resistance state and a high-resistance state when a voltage corresponding to a read level is applied to the first and second electrodes. In the low-resistance state, a current flowing through the resistance change film may change by a first amount according to a change in the voltage applied to the first and second electrodes, and in the high-resistance state, the current flowing through the resistance change film may change by a second amount, which is smaller than the first amount, according to the change in the voltage applied to the first and second electrodes. The resistance change film may be configured to be maintained in an inhibit state when a voltage corresponding to an inhibit level is applied to the first and second electrodes. In the inhibit state, the current flowing through the resistance change film may change by a third amount, which is smaller than the second amount, according to the change in the voltage applied to the first and second electrodes. A magnitude of the inhibit level may be different than a magnitude of the read level.

According to example embodiments, a nonvolatile memory device includes: a plurality of first interlayer insulating films and a plurality of first electrodes stacked alternately; a second electrode penetrating the plurality of first interlayer insulating films and the plurality of first electrodes; and a resistance change film between the plurality of first electrodes and the second electrode. The first and second electrodes may have a work function difference of 0.5 to 6 eV, and no memory cell selection elements may be between the plurality of first electrodes and the resistance change film or between the second electrode and the resistance change film.

The plurality of first electrodes may contain one of Ti and TiN, and the second electrode may contain one of Pt and Ru.

The plurality of first electrodes may contain a metal and the second electrode may contain a semiconductor material.

The plurality of first electrodes may contain one of Ti and TiN, and the second electrode may contain doped-Si.

The resistance change film may be configured to be maintained in at least one of a low-resistance state and a high-resistance state when a voltage corresponding to a read level is applied to the second electrode one of the plurality of first electrodes. In the low-resistance state, a current flowing through the resistance change film may change by a first amount according to a change in the voltage applied to the second electrode and one of the plurality of first electrodes, and in the high-resistance state, the current flowing through the resistance change film may change by a second amount, which is smaller than the first amount, according to the change in the voltage applied to the second electrode and one of the plurality of first electrodes. The resistance change film may be configured to be maintained in an inhibit state when a voltage corresponding to an inhibit level is applied to the second electrode and one of the plurality of first electrodes. In the inhibit state, the current flowing through the resistance change film may change by a third amount, which is smaller than the second amount, according to the change in the voltage applied to the second electrode and one of the plurality of first electrodes. A magnitude of the inhibit level may be different than a magnitude of the read level.

According to example embodiments, a nonvolatile memory device includes at least one stacked structure including: 1 to N first electrodes spaced apart in a vertical direction, N being an integer greater than 1, a second electrode extending vertically through the 1 to N first electrodes, a resistive change film between the 1 to N first electrodes and the second electrode, and a first barrier film between the resistive change film and the second electrode. The resistive change film may contain oxygen ions. The first barrier film may be configured to reduce the outflow of oxygen ions from the resistive change film.

Each of the at least one stacked structure may include 1 to N Schottky barriers defined by 1 to N interfaces between the 1 to N first electrodes and the resistive change film.

Each of the at least one stacked structure may further include a second barrier pattern between the 1 to N first electrodes and the resistive change film. At least one of the first barrier film and the second barrier pattern may be configured to reduce the outflow of oxygen ions from the resistive change film.

The resistance change film may be configured to be maintained in at least one of a low-resistance state and a high-resistance state when a voltage corresponding to a read level is applied to the second electrode one of the 1 to N first electrodes. In the low-resistance state, a current flowing through the resistance change film may change by a first amount according to a change in the voltage applied to the second electrode and one of the 1 to N first electrodes, and in the high-resistance state, the current flowing through the resistance change film may change by a second amount, which is smaller than the first amount, according to the change in the voltage applied to the second electrode and one of the 1 to N first electrodes. The resistance change film may be configured to be maintained in an inhibit state when a voltage corresponding to an inhibit level is applied to the second electrode and one of the 1 to N first electrodes. In the inhibit state, the current flowing through the resistance change film may change by a third amount, which is smaller than the second amount, according to the change in the voltage applied to the second electrode and one of the 1 to N first electrodes. A magnitude of the inhibit level may be different than a magnitude of the read level.

A controller may be connected to the nonvolatile memory device.

BRIEF DESCRIPTION OF THE DRAWINGS

The above and other aspects and features of example embodiments will become more apparent by the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1:
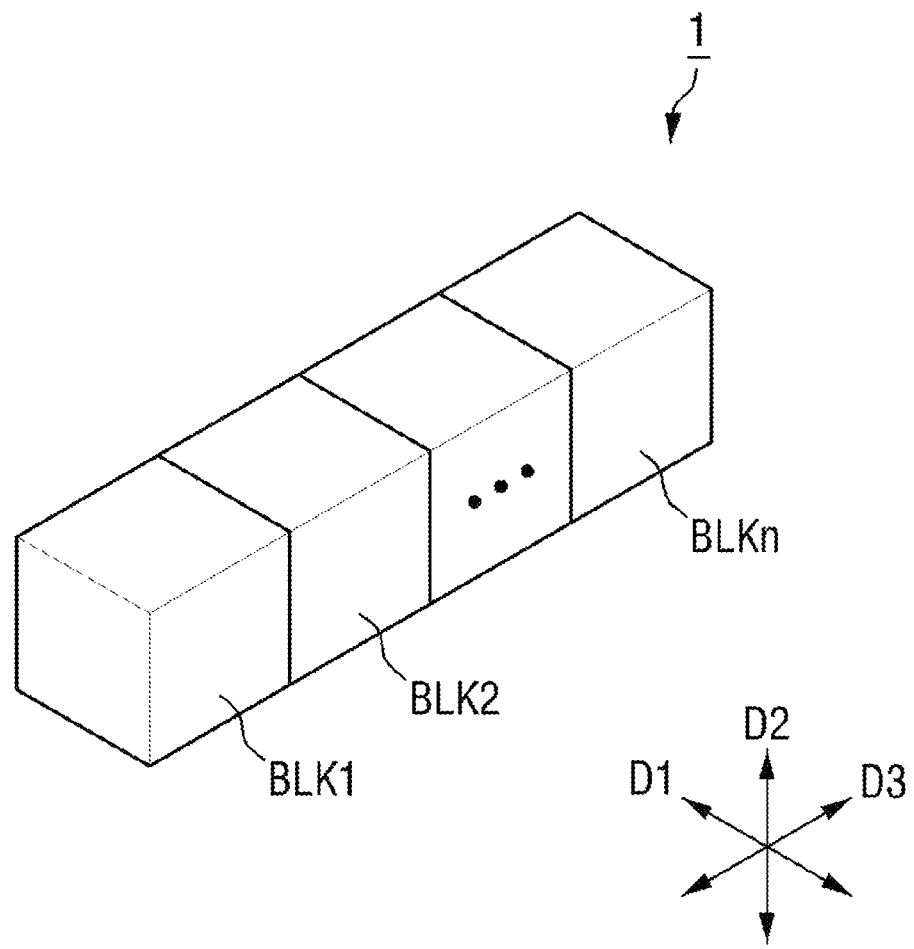
FIG. 1 is a conceptual diagram of a nonvolatile memory device according to example embodiments.

Example embodiments will now be described more fully with reference to the accompanying drawings, in which some example embodiments are shown. Example embodiments may, however, be embodied in many different forms and should not be construed as being limited to the embodiments set forth herein. Rather, these embodiments are provided so that this disclosure will be thorough and complete and will fully convey the scope of example embodiments to those skilled in the art, and example embodiments will only be defined by the appended claims. In the drawings, the thickness of layers and regions are exaggerated for clarity. Like reference numerals in the drawings denote like elements and thus their description may be omitted.

It will be understood that when an element or layer is referred to as being "on" or "connected to" or "coupled" to another element or layer, it can be directly on or connected to the other element or layer or intervening elements or layers may be present. In contrast, when an element is referred to as being "directly on" or "directly connected to" or "directly coupled" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are to be construed to cover both the singular and the plural forms, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a nonvolatile memory cell and a nonvolatile memory device including the same according to example embodiments will be described with reference to FIGS. 1 through 4.

Figure 2:
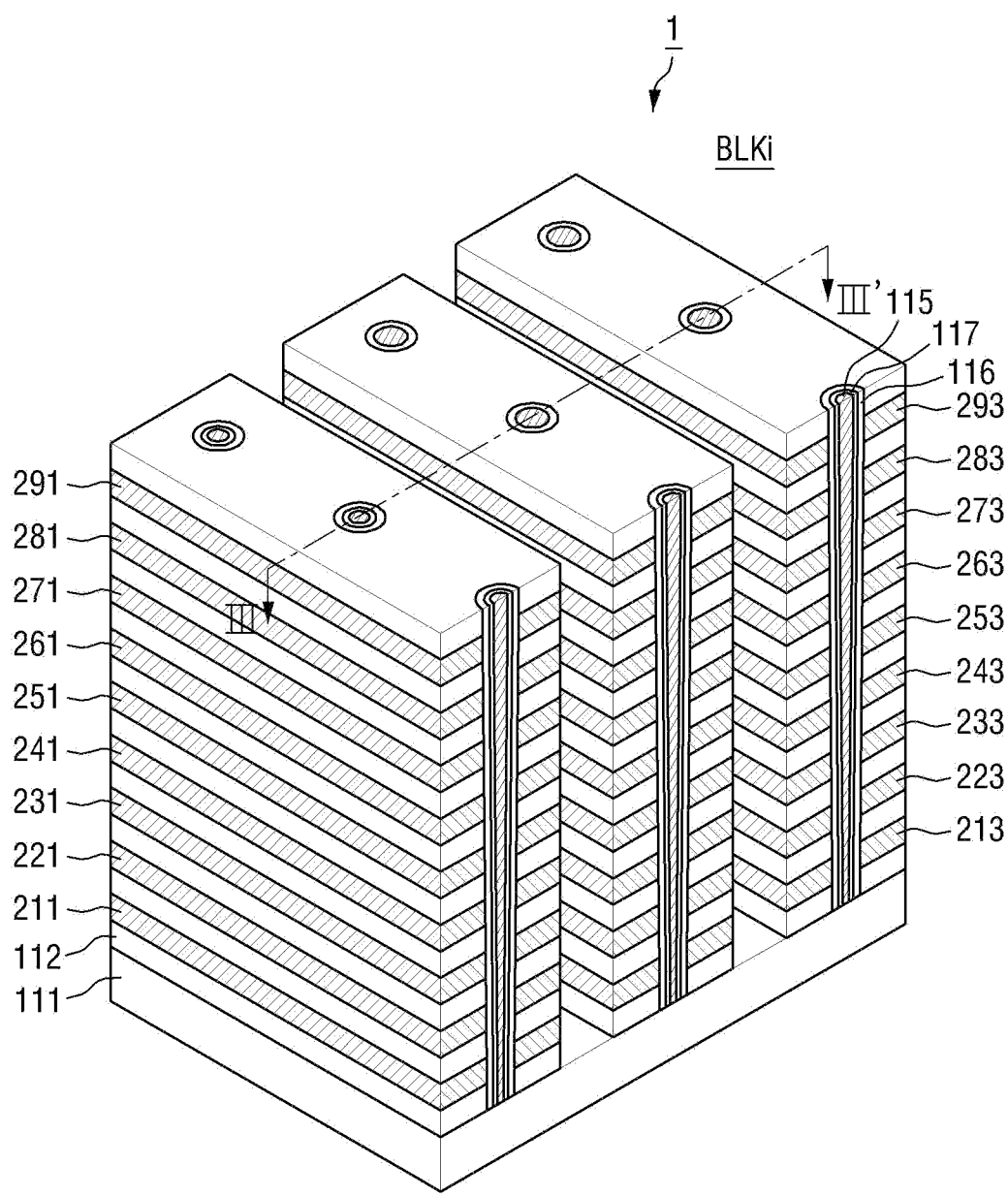
FIG. 2 is a perspective view of a memory block shown in FIG. 1.
Figure 3:
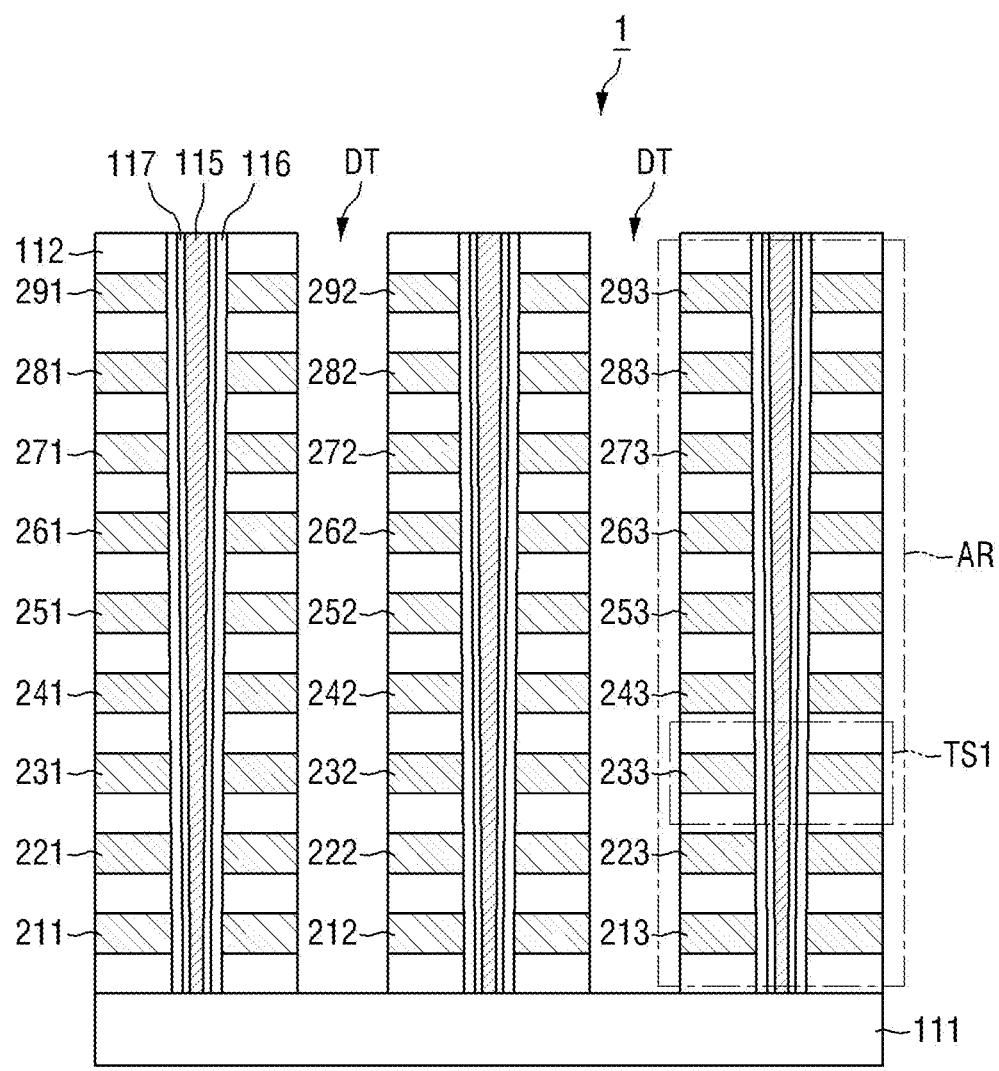
FIG. 3 is a cross-sectional view taken along the line III-III' of FIG. 2.
Figure 4:
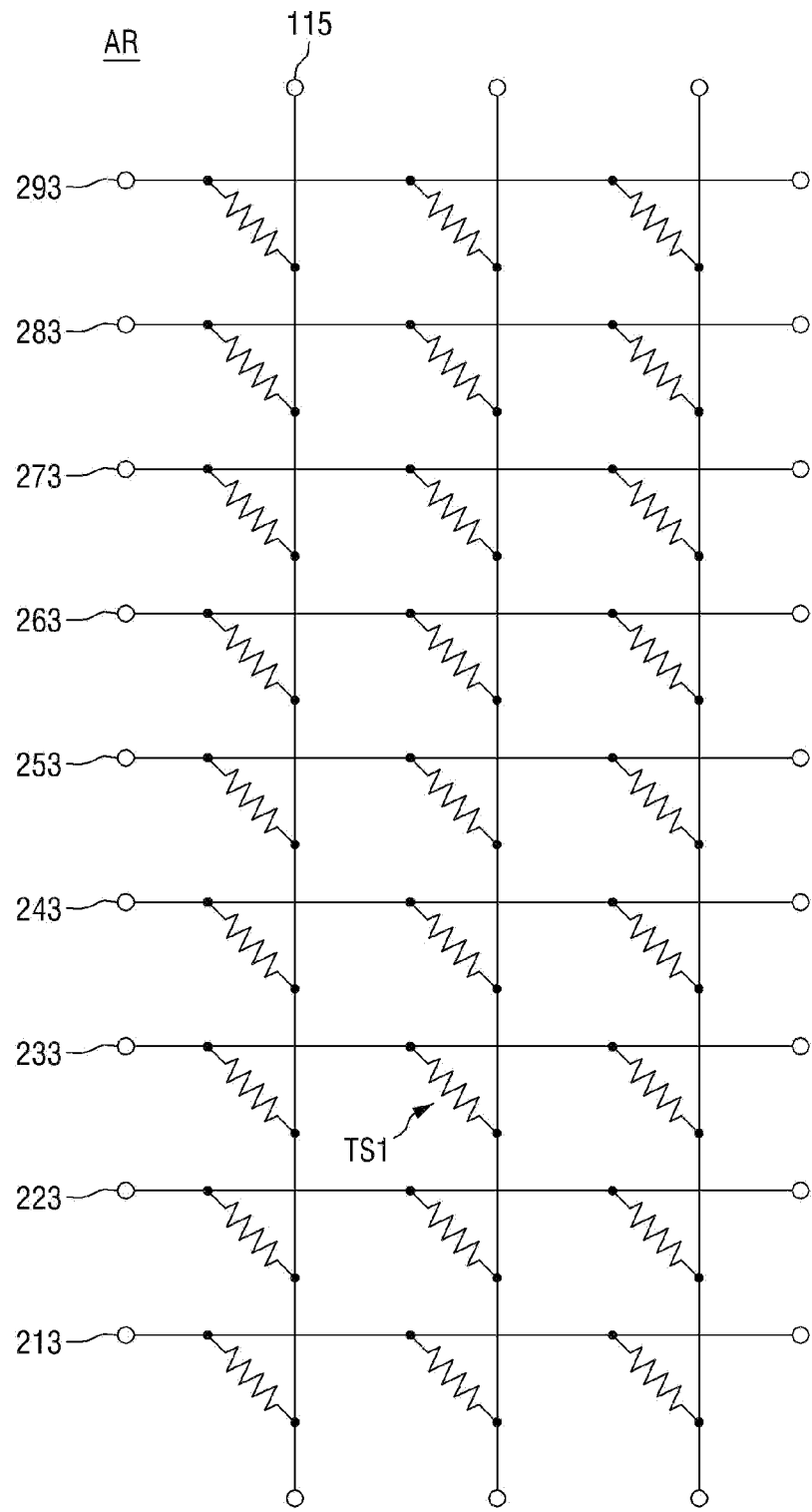
FIG. 4 is a circuit diagram of a region AR shown in FIG. 3, illustrating part of a memory cell array according to example embodiments.

FIG. 1 is a conceptual diagram of a nonvolatile memory device 1 according to example embodiments. FIG. 2 is a perspective view of a memory block shown in FIG. 1. FIG. 3 is a cross-sectional view taken along the line III-III' of FIG. 2. FIG. 4 is a circuit diagram of a region AR shown in FIG. 3, illustrating part of a memory cell array of the nonvolatile memory device 1 in FIG. 1.

Referring to FIG. 1, the memory cell array of the nonvolatile memory device 1 may include a plurality of memory blocks BLK1 through BLKn, where n is a natural number. Each of the memory blocks BLK1 through BLKn may extend in first through third directions D1 through D3. As shown in the drawing, the first through third directions D1 through D3 are different from each other and may intersect each other. For example, the first through third directions D1 through D3 may intersect each other at right angles, but example embodiments are not limited thereto.

Referring to FIGS. 2 through 4, a memory block BLKi (1<i<n, where i is a natural number) may include a plurality of first interlayer insulating films 112, a plurality of first electrodes 211 through 291, 212 through 292 and 213 through 293, a plurality of second electrodes 115, a plurality of resistance change films 116, and a plurality of first barrier films 117 formed on a lower interlayer insulating film 111.

Although not shown in the drawings, a plurality of bit lines (not shown) and a plurality of bit line contacts (not shown) may be formed in the lower interlayer insulating film 111. The bit line contacts (not shown) formed in the lower interlayer insulating film 111 may be electrically connected to the bit lines (not shown) and at least some of the second electrodes 115.

In example embodiments, the bit lines (not shown) and the bit line contacts (not shown) may not be formed in the lower interlayer insulating film 111. Instead, the bit lines (not shown) and the bit line contacts (not shown) may be formed on the second electrodes 115. When the bit lines (not shown) and the bit line contacts (not shown) are formed on the second electrodes 115, the bit line contacts (not shown) may be electrically connected to the bit lines (not shown) formed on the second electrodes 115 and at least some of the second electrodes 115.

The first interlayer insulating films 112 may be separated from each other in the second direction D2 and may be sequentially stacked on the lower interlayer insulating film 111 in the second direction D2. As shown in FIG. 2, each of the first interlayer insulating films 112 may extend in the first direction D1.

The second electrodes 115 may extend in the second direction D2, and the first electrodes 211 through 291, 212 through 292 and 213 through 293 may extend in the first direction D1. Specifically, the second electrodes 115 may be disposed on the lower interlayer insulating film 111 in the form of pillars and may penetrate the stacked first interlayer insulating films 112 and the first electrodes 211 through 291, 212 through 292 and 213 through 293.

The first electrodes 211 through 291, 212 through 292 and 213 through 293 may respectively be formed between the stacked first interlayer insulating films 112. The first electrodes 211 through 291, 212 through 292 and 213 through 293 may intersect the second electrodes 115.

Referring to FIGS. 2 and 3, the second electrodes 115 may be separated from each other in the first direction D1 and the third direction D3. That is, the second electrodes 115 may be arranged in a matrix. In the drawings, the second electrodes 115 are arranged in a 3×3 matrix. However, example embodiments are not limited thereto.

An isolation trench DT may be formed in the first interlayer insulating films 112 between the second electrodes 115 arranged in the third direction D3. Side surfaces of each group of the first electrodes 211 through 291, 212 through 292 or 213 through 293 which are exposed by the isolation trench DT may be aligned with side surfaces of a corresponding group of the first interlayer insulating films 112 which are exposed by the isolation trench DT.

Each of the resistance change films 116 may be interposed between one of the second electrodes 115 and a corresponding group of the first electrodes 211 through 291, 212 through 292 or 213 through 293. Specifically, each of the resistance change films 116 may extend parallel to a corresponding one of the second electrodes 115 along a side surface of the corresponding one of the second electrodes 115 in the second direction D2.

Although each of the resistance change films 116 extends parallel to a corresponding one of the second electrodes 115 along a side surface of the corresponding one of the second electrodes 115 in the drawings, the shape of each of the resistance change films 116 can be modified as desired without departing from the technical spirit of example embodiments.

The resistance change films 116 may be, for example, transition metal oxide (TMO) that contains oxygen ions. Specifically, examples of the TMO may include, but is not limited to, HfOx, TiOx, TaOx, ZnOx, TiOx, NbOx, ZrOx, NiOx, WOx, and AlOx.

The first barrier films 117 may be formed between the second electrodes 115 and the resistance change films 116, respectively. The first barrier films 117 reduce (and/or block) the outflow of oxygen ions from the resistance change films 116, thereby maintaining the resistance change films 116 in a high-resistance state in a certain voltage section (e.g., an inhibit voltage section). The role of the first barrier films 117 will be described in more detail later when a nonvolatile memory cell TS1 according to example embodiments is described.

The first barrier films 117 may be made of, e.g., AlOx, AlOxNy, SiOx, SiNx, or SiOxNy. According to example embodiments, the first barrier films 117 may be made of a high-K dielectric such as at least one of HfOx, ZrOx, TiOx, LaOx, or SrOx. According to example embodiments, the first barrier films 117 may be made of a silicidated or nitridated high-K dielectric such as HfSiOx or HfSiOxNy. A high-K dielectric is a material having a higher dielectric constant than silicon oxide, such as material having a dielectric constant of about 5 to about 30, or greater.

Each group of the first electrodes 211 through 291, 212 through 292 or 213 through 293 arranged in the second direction D2 may share the second electrodes 115, the resistance change films 116, and the first barrier films 117.

The first electrodes 211 through 291, 212 through 292 and 213 through 293 may be made of a material with a work function of 4.5 to 6 eV. Examples of the material that satisfies this work function condition may include, but are not limited to, Ni, Cu, Ru, W, Ir, Pt, Au, and Pd. When the first electrodes 211 through 291, 212 through 292 and 213 through 293 have a work function of 4.5 to 6 eV, Schottky barriers may be formed between the resistance change films 116 and the first electrodes 211 through 291, 212 through 292 and 213 through 293. The role of the Schottky barriers will be described in more detail later when the nonvolatile memory cell TS1 according to example embodiments is described.

Referring to FIG. 4, the first electrodes 213 through 293, the second electrodes 115, and the resistance change films 116 form a memory cell array. A resistance change film 116 disposed in each region in which one of the first electrodes 213 through 293 intersects a second electrode 115 defines each nonvolatile memory cell TS1. As shown in FIG. 4, no memory cell selection elements are formed between the first electrodes 213 through 293 and the resistance change films 116 or between the second electrodes 115 and the resistance change films 116. According to example embodiments, a memory cell selection element (such as a transistor or a diode) for selecting each nonvolatile memory cell TS1 is not formed in the memory cell array.

The omission of the memory cell selection element from the memory cell array according to example embodiments may be attributable to an inhibit characteristic of each nonvolatile memory cell TS1. A nonvolatile memory cell according to example embodiments will now be described with reference to FIGS. 5 through 7.

Figure 5:
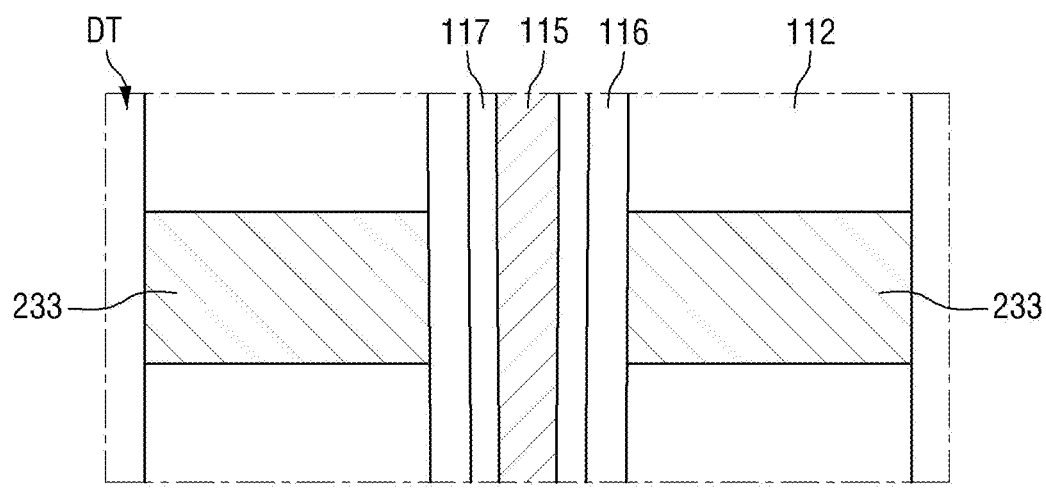
FIG. 5 is a detailed enlarged view of a region TS1 shown in FIG. 3, illustrating a nonvolatile memory cell according to example embodiments.
Figure 6:
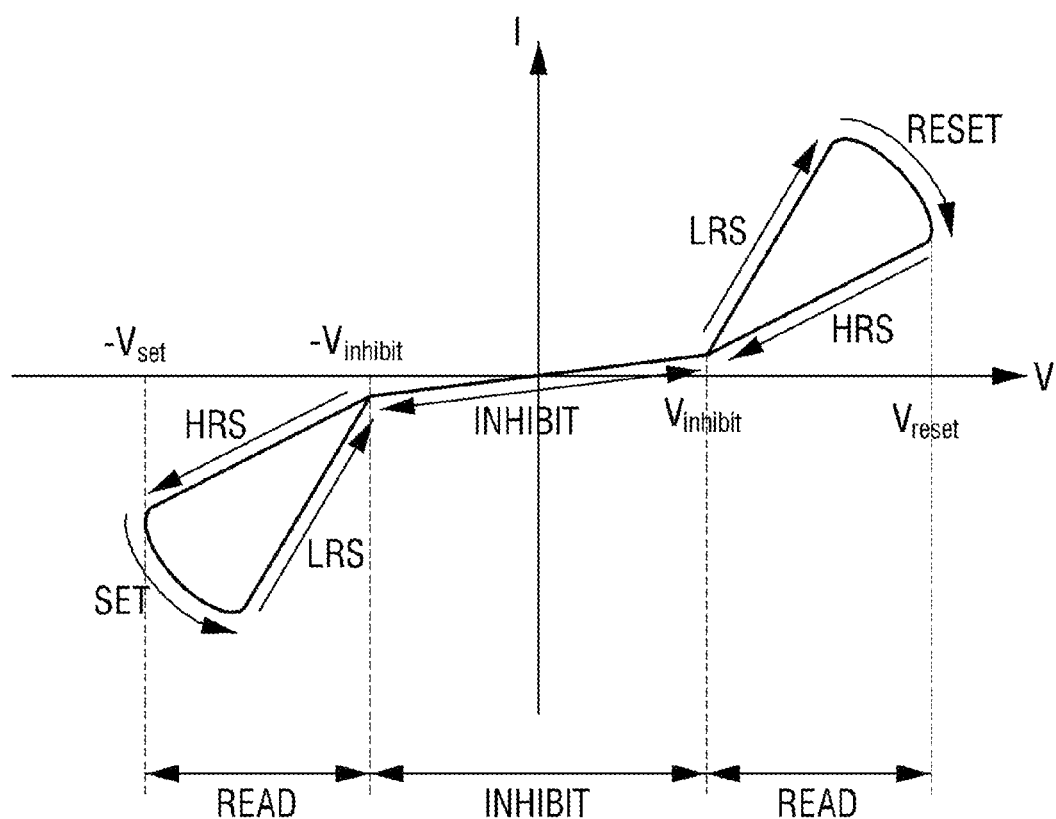
FIG. 6 is a graph illustrating a conceptual voltage-current curve of the nonvolatile memory cell according to example embodiments.
Figure 7:
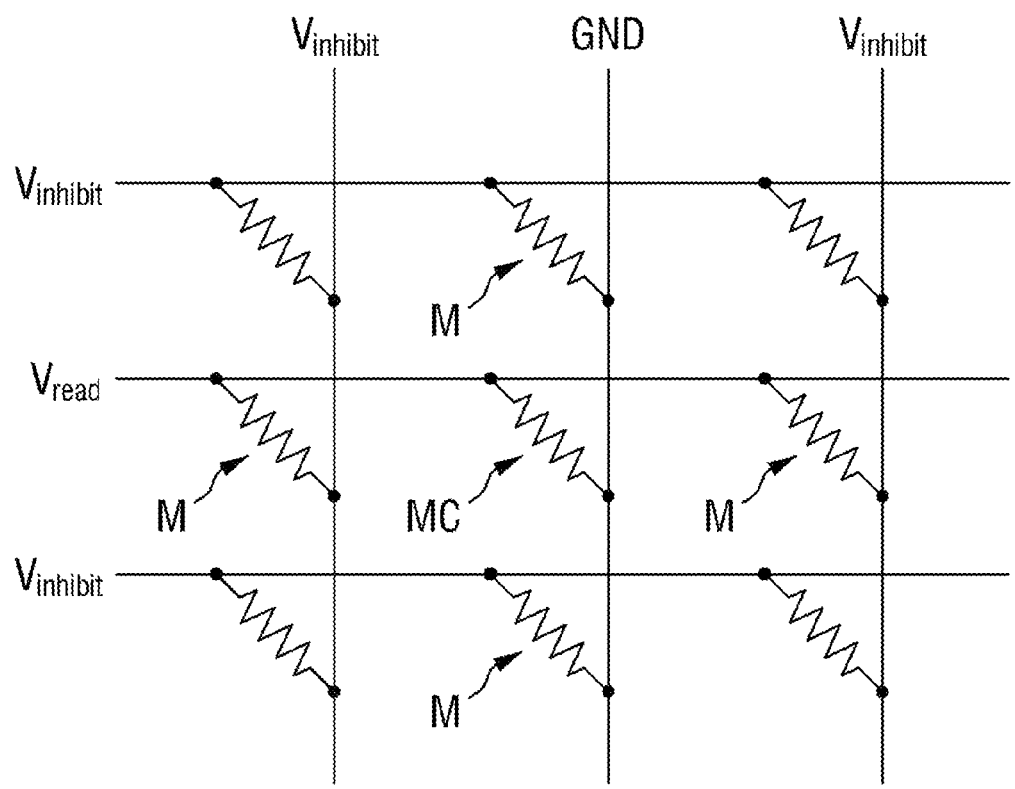
FIG. 7 is a diagram illustrating the effects of the nonvolatile memory device including the nonvolatile memory cell according to example embodiments.

FIG. 5 is a detailed enlarged view of a region TS1 shown in FIG. 3, illustrating a nonvolatile memory cell according to example embodiments. FIG. 6 is a graph illustrating a conceptual voltage-current curve of the nonvolatile memory cell according to example embodiments. FIG. 7 is a diagram illustrating the effects of the nonvolatile memory device 1 including the nonvolatile memory cell according to example embodiments.

Referring to FIG. 5, a nonvolatile memory cell TS1 according to example embodiments may include first and second electrodes 233 and 115, a resistance change film 116 formed between the first electrode 233 and the second electrode 115, and a first barrier film 117 formed to contact the second electrode 115 and the resistance change film 116.

As described above, the resistance change film 116 may contain oxygen ions, and the first barrier film 117 may reduce (and/or block) the outflow of oxygen ions from the resistance change film 116 at a certain voltage level (e.g., an inhibit voltage level). Accordingly, the nonvolatile memory cell TS1 according to example embodiments can remain in a high-resistance state, in which the resistance of the resistance change film 116 is close to a diode characteristic, at a certain voltage level (e.g., an inhibit voltage level).

In addition, as described above, the first electrode 233 may be made of a material with a work function of 4.5 to 6 eV. When the first electrode 233 is made of a material with a work function of 4.5 to 6 eV, a Schottky barrier may be formed between the resistance change film 116 and the first electrode 233. Similar to the first barrier film 117, the Schottky barrier may maintain the nonvolatile memory cell TS1 in a high-resistance state, in which the resistance of the resistance change film 116 is close to the diode characteristic, at a certain voltage level (e.g., an inhibit voltage level).

These characteristics of the nonvolatile memory cell TS1 cause the nonvolatile memory cell TS1 to have the voltage-current curve shown in FIG. 6. In FIG. 6, the voltage-current curve of a nonvolatile memory cell TS1 according to example embodiments is conceptually simplified for ease of description. Therefore, the actual voltage-current curve of the nonvolatile memory cell TS1 according to example embodiments may be somewhat different from the illustration of FIG. 6 although it has characteristics described below.

Referring to FIG. 6, when a voltage corresponding to a read level READ is applied to the first and second electrodes 233 and 115, the resistance change film 116 is maintained in any one of a low-resistance state LRS in which a current flowing through the resistance change film 116 is changed by a first amount according to a change in the voltage applied to the first and second electrodes 233 and 115 and a high-resistance state HRS in which the current flowing through the resistance change film 116 is changed (that is, the slope of the voltage-current curve is reduced) by a second amount which is smaller than the first amount according to the change in the voltage applied to the first and second electrodes 233 and 115.

When the resistance change film 116 is maintained in the low-resistance state LRS, the nonvolatile memory cell TS1 may store first data (e.g., one). When the resistance change film 116 is maintained in the high-resistance state HRS, the nonvolatile memory cell TS1 may store second data (e.g., zero).

Here, if a reset voltage Vreset or a set voltage −Vset is applied to the nonvolatile memory cell TS1, the data stored in the nonvolatile memory cell TS1 changes. Specifically, when the reset voltage Vreset is applied to the nonvolatile memory cell TS1 maintained in the low-resistance state LRS (i.e., the nonvolatile memory cell TS1 that stores one), the resistance change film 116 is changed to the high-resistance state HRS as shown in the drawing. Here, zero is programmed into the nonvolatile memory cell TS1. Conversely, when the set voltage −Vset is applied to the nonvolatile memory cell TS1 maintained in the high-resistance state HRS (i.e., the nonvolatile memory cell TS1 that stores zero), the resistance change film 116 is changed to the low-resistance state LRS as shown in the drawing. Here, one is programmed into the nonvolatile memory cell TS1.

Meanwhile, when a voltage corresponding to an inhibit level INHIBIT is applied to the first and second electrodes 233 and 115, the resistance change film 116 is maintained in an inhibit state in which the current flowing through the resistance change film 116 is changed (that is, the slope of the voltage-current curve is reduced) by a third amount which is smaller than the second amount according to the change in the voltage applied to the first and second electrodes 233 and 115. In other words, when the voltage corresponding to the inhibit level INHIBIT is applied to the first and second electrodes 233 and 115, the resistance of the resistance change film 116 of the nonvolatile memory cell TS1 according to example embodiments becomes very large due to the presence of the first barrier film 117 and the Schottky barrier. Therefore, virtually no current flows through the resistance change film 116 while the voltage corresponding to the inhibit level INHIBIT is applied to the nonvolatile memory cell TS1.

By taking advantage of these characteristics of a nonvolatile memory cell TS1 according to example embodiments, a nonvolatile memory device that can operate in a reliable manner can be realized without the formation of a selection element (such as a transistor or a diode) in each nonvolatile memory cell TS1.

For example, data stored in a nonvolatile memory cell MC of a memory cell array shown in FIG. 7 may be read as follows.

In example embodiments, to read the data stored in the nonvolatile memory cell MC, a read voltage Vread corresponding to a read level may be applied to a first electrode electrically connected to the nonvolatile memory cell MC, a ground voltage GND may be applied to a second electrode electrically connected to the nonvolatile memory cell MC, and a voltage Vinhibit corresponding to an inhibit level may be applied to the other first and second electrodes which are not electrically connected to the nonvolatile memory cell MC.

When voltages are applied to the memory cell array as described above, virtually no current (or substantially no current) is output from nonvolatile memory cells other than the nonvolatile memory cell MC to be read. Therefore, if the size of a current output is identified, the data stored in the nonvolatile memory cell MC can be read accurately.

However, if each nonvolatile memory cell does not have the inhibit characteristic unlike in example embodiments, a current (e.g., a sneak current) output from nonvolatile memory cells M which share the first electrode or the second electrode with the nonvolatile memory cell MC to be read may be added to a read current output from the nonvolatile memory cell MC. In this case, even if the size of an output current is identified, the data stored in the nonvolatile memory cell MC cannot be read accurately. Therefore, a memory cell selection element (such as a transistor or a diode) for removing a current output from each of the nonvolatile memory cells M which share the first electrode or the second electrode with the nonvolatile memory cell MC to be read may be required.

Hereinafter, a nonvolatile memory cell and a nonvolatile memory device according to example embodiments will be described with reference to FIGS. 8A and 9A. For simplicity, a description of elements that are identical (or substantially identical) to those described previously will be omitted, and differences between elements described previously and the elements in FIGS. 8A and 9A will mainly be described.

Figure 8A:
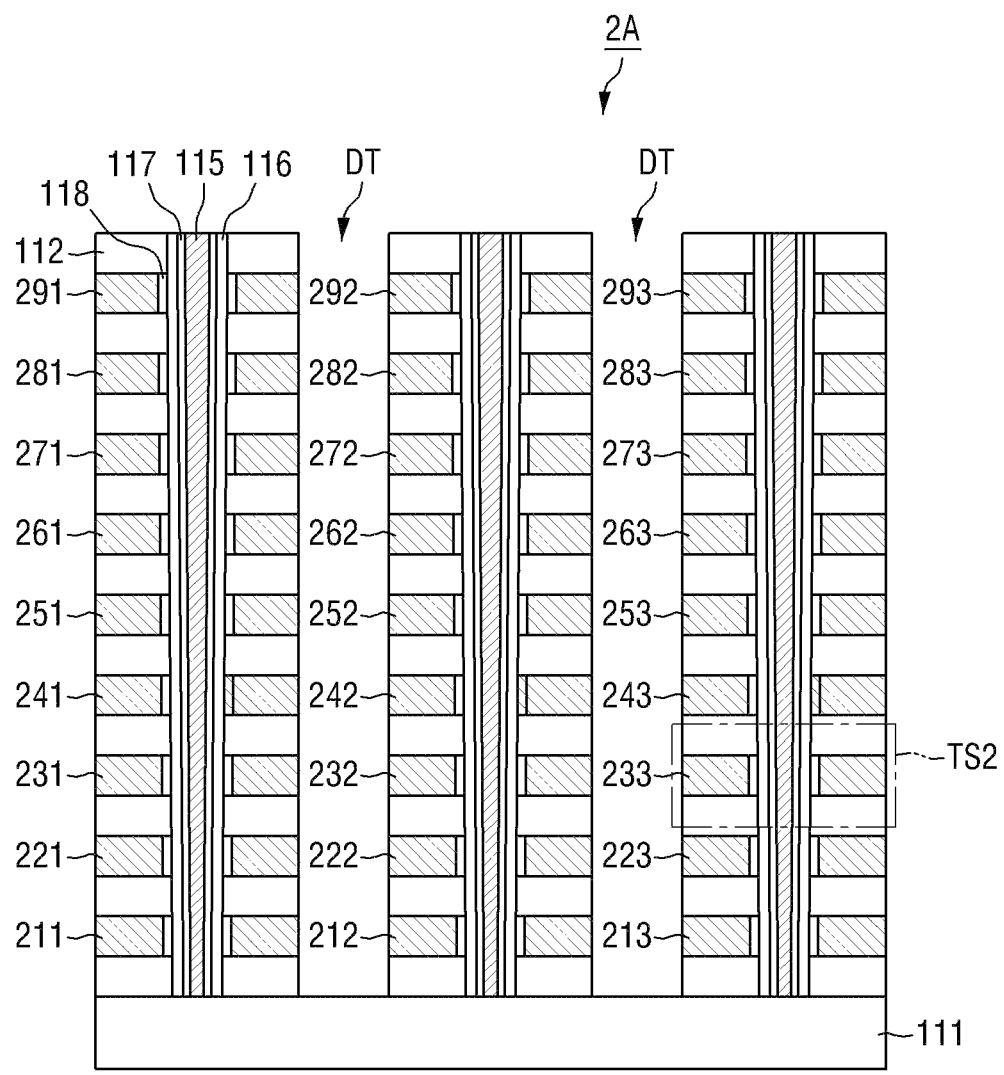
FIGS. 8A, 8B, and 8C are cross-sectional views of nonvolatile memory devices according to example embodiments.

FIG. 8A is a cross-sectional view of a nonvolatile memory device 2A according to example embodiments. FIG. 9A is a detailed enlarged view of a region TS2 shown in FIG. 8, illustrating a nonvolatile memory cell according to example embodiments.

Figure 9A:
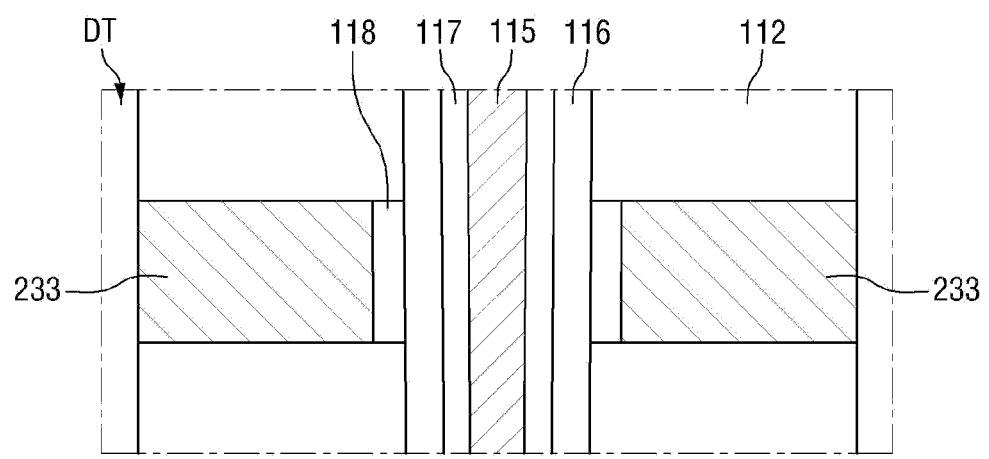
FIGS. 9A, 9B, and 9C are detailed enlarged views of region TS2, TS2', and TS2" shown in FIGS. 8A, 8B, and 8C, illustrating a nonvolatile memory cell according to example embodiments.

Referring to FIGS. 8A and 9A, the nonvolatile memory device 2A may further include a plurality of second barrier films 118.

The second barrier films 118 may respectively be formed between a plurality of first electrodes 211 through 291, 212 through 292 and 213 through 293 and a plurality of resistance change films 116. Specifically, the second barrier films 118 may respectively be formed between the first electrodes 211 through 291, 212 through 292 and 213 through 293 and the resistance change films 116 to contact the first electrodes 211 through 291, 212 through 292 and 213 through 293 and the resistance change films 116.

Like a plurality of first barrier films 117 described above, the second barrier films 118 reduce (and/or block) the outflow of oxygen ions from the resistance change films 116, thereby maintaining the resistance change films 116 in a high-resistance state in a certain voltage section (e.g., an inhibit voltage section). Due to this characteristic of the second barrier films 118, no memory cell selection elements are formed between the first electrodes 211 through 291, 212 through 292 and 213 through 293 and the resistance change films 116 or between a plurality of second electrodes 115 and the resistance change films 116 of the nonvolatile memory device 2A according to example embodiments.

According to example embodiments, a material that forms the first barrier films 117 adjacent to the second electrodes 115 may be different from a material that forms the second barrier films 118 adjacent to the first electrodes 211 through 291, 212 through 292 and 213 through 293. Specifically, the first barrier films 117 may contain a first material which is any one of AlOx, AlOxNy, SiNx, SiOxNy, a high-K dielectric such as HfOx, ZrOx, TiOx, LaOx or SrOx, and a silicidated or nitridated high-K dielectric such as HfSiOx or HfSiOxNy. In this case, the second barrier films 118 may contain a second material which is different from the first material and is any one of AlOx, AlOxNy, SiNx, SiOxNy, a high-K dielectric such as HfOx, ZrOx, TiOx, LaOx or SrOx, and a silicidated or nitridated high-K dielectric such as HfSiOx or HfSiOxNy.

Referring to FIG. 9A, a second barrier film 118 is formed between a first electrode 233 and a resistance change film 116 of a nonvolatile memory cell TS according to example embodiments, and a first barrier film 117 is formed between a second electrode 115 and the resistance change film 116. The first and second barrier films 117 and 118 reduce (and/or block) the outflow of oxygen ions from the resistance change film 116, thereby maintaining the resistance change film 116 in a high-resistance state in an inhibit level voltage section as shown in FIG. 6. Therefore, when a voltage corresponding to an inhibit level INHIBIT is applied to the first electrode 233 and the second electrode 115, virtually no current flows through the resistance change film 116.

Hereinafter, a nonvolatile memory cell and a nonvolatile memory device according to example embodiments will be described with reference to FIGS. 8B and 9B. For simplicity, a description of elements that are identical (or substantially identical) to those described previously will be omitted, and differences between elements described previously and the elements in FIGS. 8B and 9B will mainly be described.

Figure 8B:
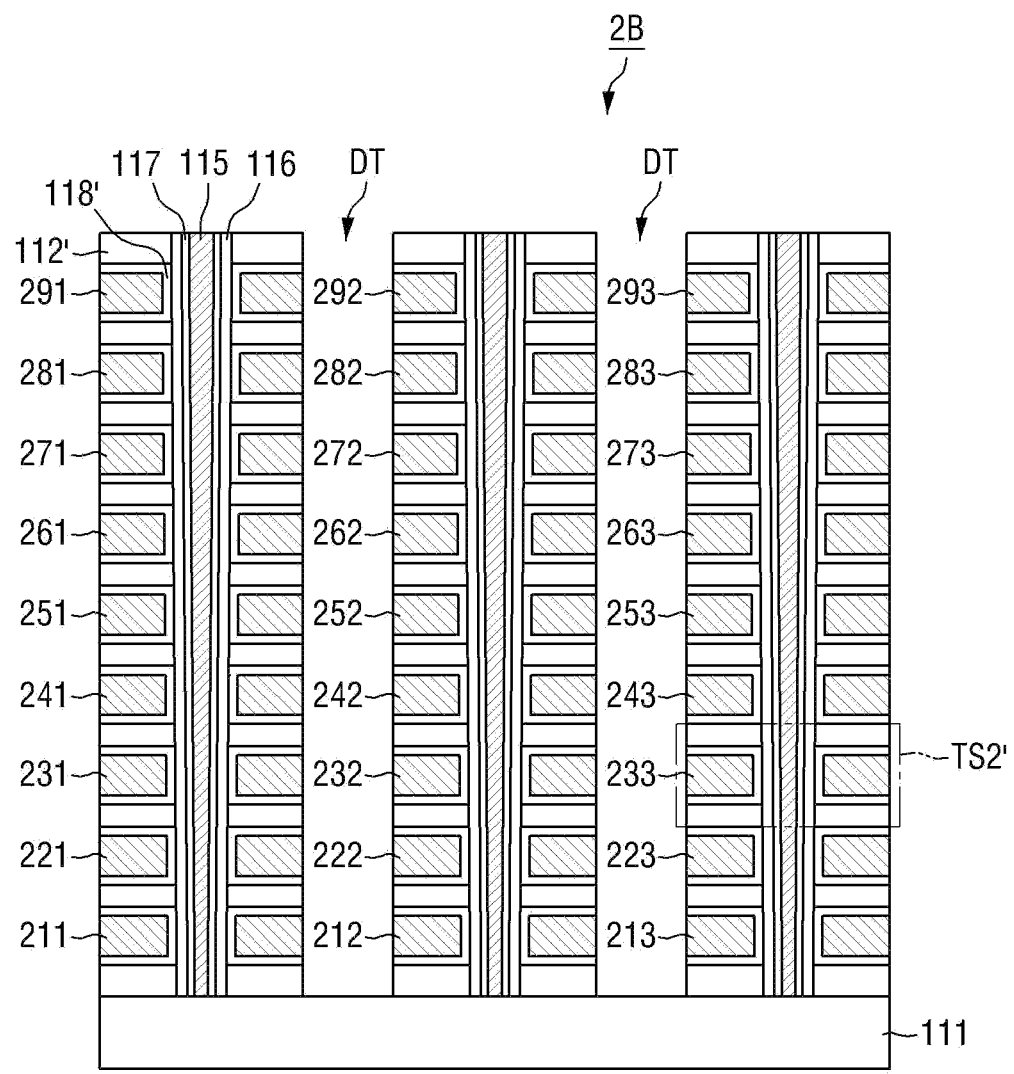

FIG. 8B is a cross-sectional view of a nonvolatile memory device 2B according to example embodiments. FIG. 9B is a detailed enlarged view of a region TS2' shown in FIG. 8B illustrating a nonvolatile memory cell according to example embodiments.

Figure 9B:
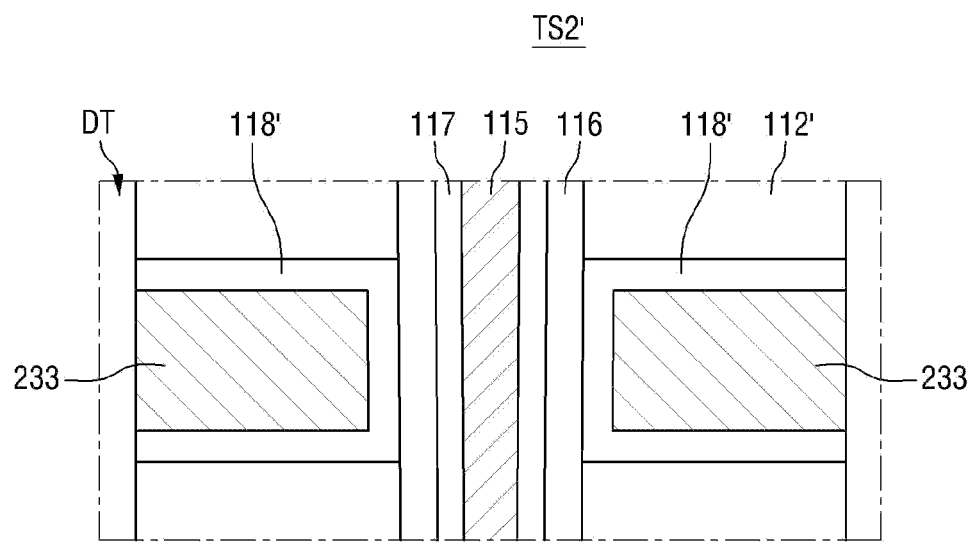

Referring to FIGS. 8B and 9B, the nonvolatile memory device 2B may be the same as the nonvolatile memory device 2A described previously in FIGS. 8A and 9A, except for the structure of the first interlayer insulating films 112' and second barrier films 118'.

As shown in FIGS. 8B and 9B, the second barrier films 118' may be formed to cover upper, side, and lower surfaces of the first electrodes 211 through 291, 212 through 292, and 213 through 293. As a result, the second barrier films 118' may be formed between the first interlayer insulating films 112' and the first electrodes 211 through 291, 212 through 292, and 213 through 293.

A material of the second barrier films 118' may be the same as the second barrier films 118 described previously in FIGS. 8A and 9A. A material of the first interlayer insulating films 112' may be the same as the first interlayer insulating films 112 described previously in FIGS. 2, 3, 8A and 9A.

Hereinafter, a nonvolatile memory cell and a nonvolatile memory device according to example embodiments will be described with reference to FIGS. 8C and 9C. For simplicity, a description of elements that are identical (or substantially identical) to those described previously will be omitted, and differences between elements described previously and the elements in FIGS. 8C and 9C will mainly be described.

Figure 8C:
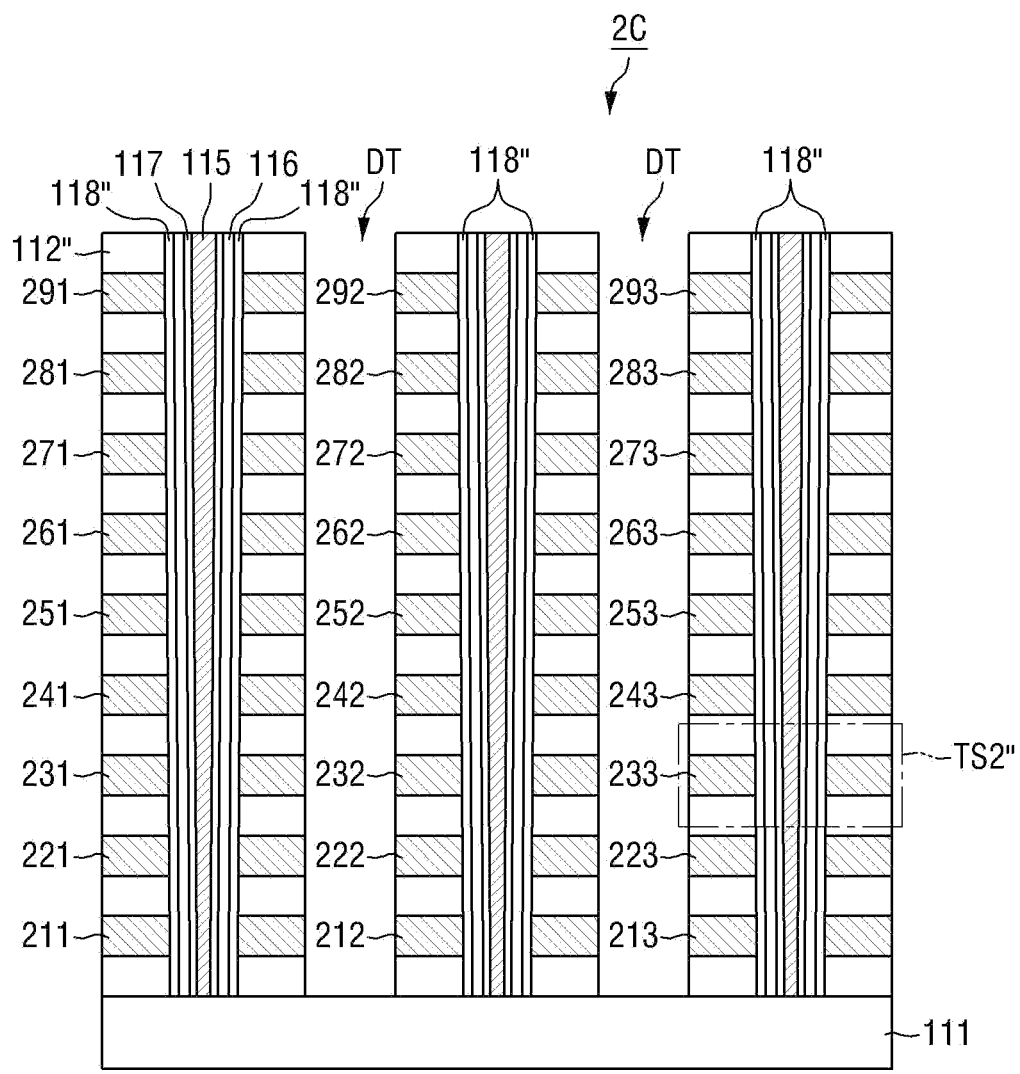

FIG. 8C is a cross-sectional view of a nonvolatile memory device 2C according to example embodiments. FIG. 9C is a detailed enlarged view of a region TS2' shown in FIG. 8B illustrating a nonvolatile memory cell according to example embodiments.

Figure 9C:
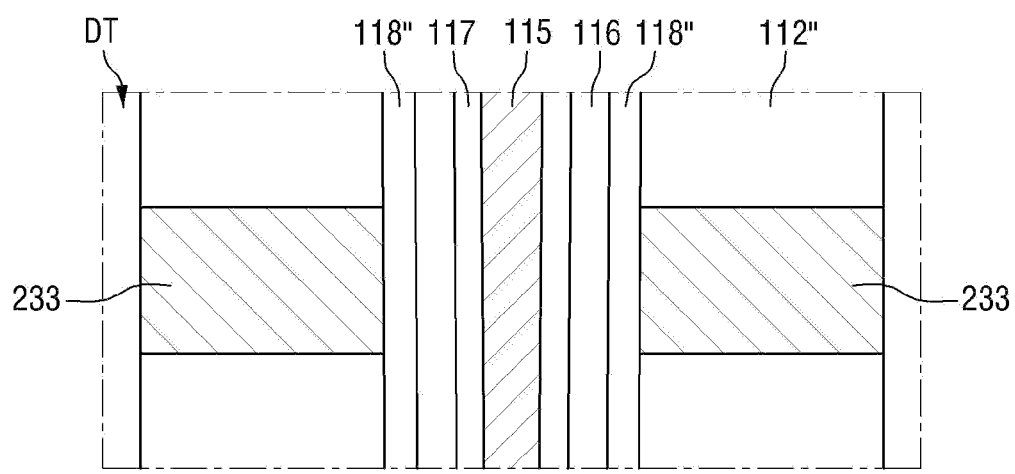

Referring to FIGS. 8C and 9C, the nonvolatile memory device 2C may be the same as the nonvolatile memory device 2A described previously in FIGS. 8A and 9A, except for the structure of the first interlayer insulating films 112" and second barrier films 118".

As shown in FIGS. 8C and 9C, the second barrier films 118" may be formed between the first interlayer insulating films 112" and the resistance change films 116. The second barrier films 118" may also be formed between the first electrodes first electrodes 211 through 291, 212 through 292, and 213 through 293, and the resistance change films 116.

A material of the second barrier films 118" may be the same as the second barrier films 118 described previously in FIGS. 8A and 9A. A material of the first interlayer insulating films 112" may be the same as the first interlayer insulating films 112 described previously in FIGS. 2, 3, 8A and 9A.

Hereinafter, a nonvolatile memory cell and a nonvolatile memory device according to example embodiments will be described with reference to FIGS. 10 and 11. For simplicity, a description of elements substantially identical to those of the previous embodiments will be omitted, and differences between the current and previous embodiments will mainly be described.

Figure 10:
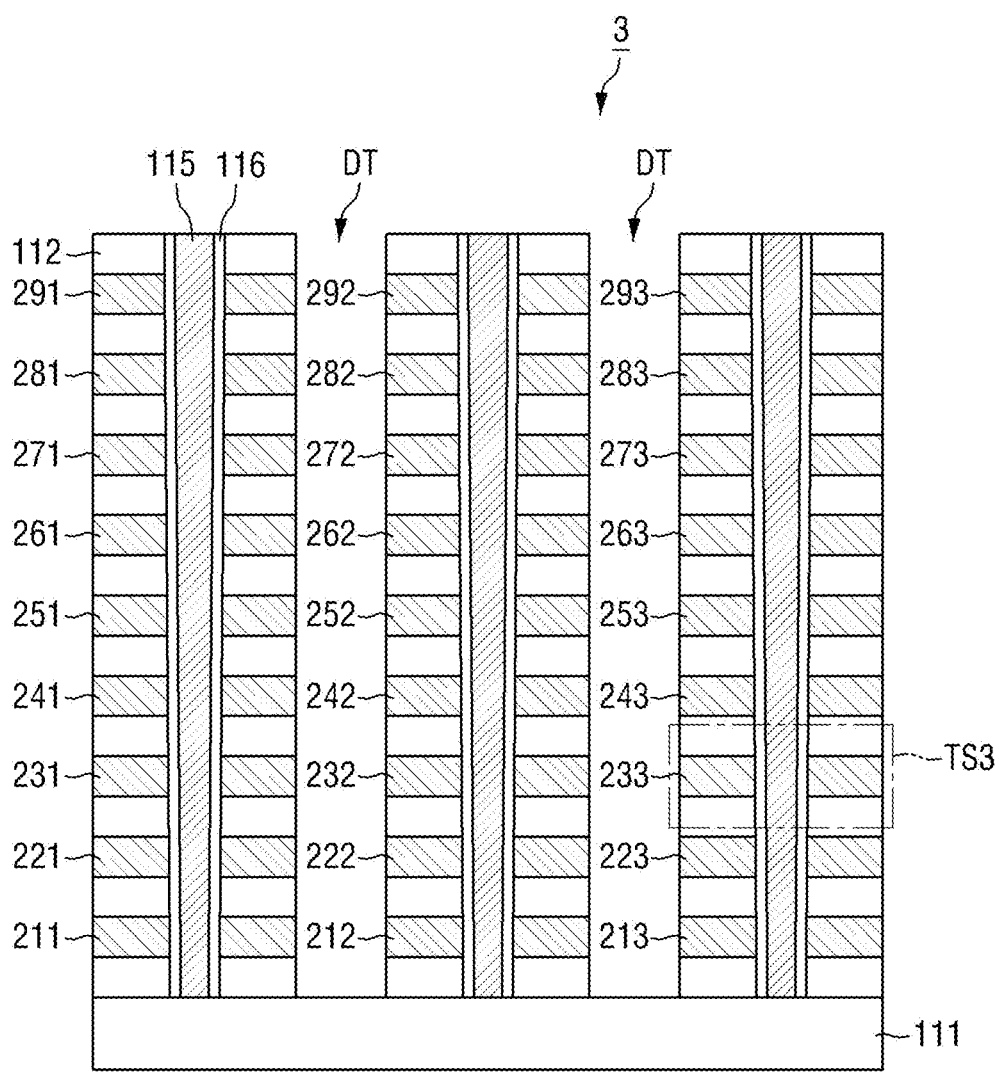
FIG. 10 is a cross-sectional view of a nonvolatile memory device according to example embodiments.

FIG. 10 is a cross-sectional view of a nonvolatile memory device 3 according to example embodiments. FIG. 11 is a detailed enlarged view of a region TS3 shown in FIG. 10, illustrating a nonvolatile memory cell according to example embodiments.

Figure 11:
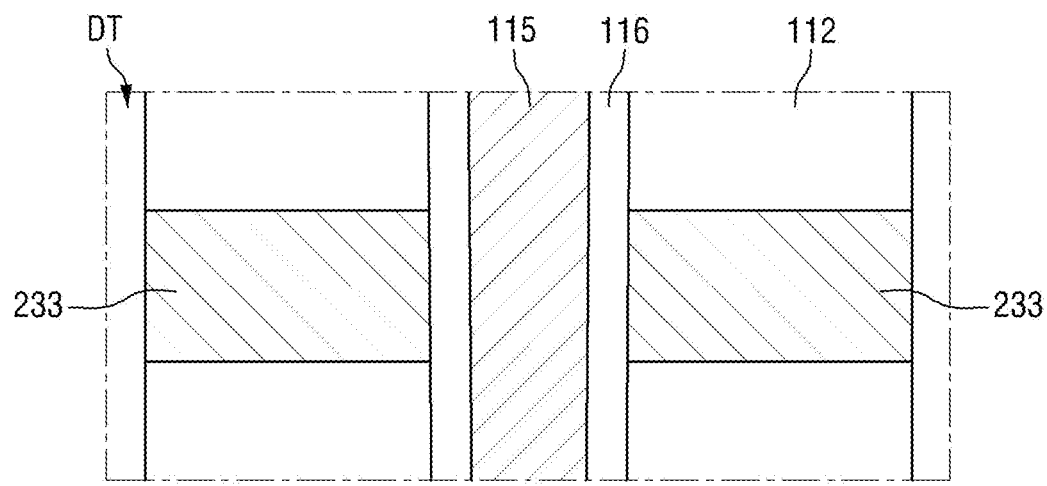
FIG. 11 is a detailed enlarged view of a region TS3 shown in FIG. 10, illustrating a nonvolatile memory cell according to example embodiments.

Referring to FIGS. 10 and 11, a plurality of barrier films 117 (see e.g., FIG. 8A) and a plurality of second barrier films 118 (see e.g., FIG. 8A) may be omitted from the nonvolatile memory device 3. In example embodiments, however, a plurality of first electrodes 211 through 291, 212 through 292 and 213 through 293 may have a different work function from a plurality of second electrodes 115. Specifically, in example embodiments, a difference between a work function of the first electrodes 211 through 291, 212 through 292 and 213 through 293 and a work function of the second electrodes 115 may be 0.5 to 6 eV.

When the difference between the work function of the first electrodes 211 through 291, 212 through 292 and 213 through 293 and the work function of the second electrodes 115 is 0.5 to 6 eV, Schottky barriers may be formed between the first electrodes 211 through 291, 212 through 292 and 213 through 293 and a plurality of resistance change films 116 and between the second electrodes 115 and the resistance change films 116. As described above, a Schottky barrier may maintain a nonvolatile memory cell TS3 in a high-resistance state, in which the resistance of a resistance change film 116 is close to a diode characteristic, at a certain voltage level (e.g., an inhibit voltage level).

Therefore, the resistance change film 116 of the nonvolatile memory cell TS3 according to example embodiments may remain in a high-resistance state in an inhibit level voltage section, as shown in FIG. 6.

The first electrodes 211 through 291, 212 through 292 and 213 through 293 and the second electrodes 115 may all contain metal. In this case, examples of a combination of the first and second electrodes 211 through 291, 212 through 292, 213 through 293 and 115 which contain metal and have a work function difference of 0.5 to 6 eV may include, but are not limited to, Ti—Pt, Ti—Ru, TiN—Pt, and TiN—Ru.

In some other embodiments, the first electrodes 211 through 291, 212 through 292 and 213 through 293 may contain metal, and the second electrodes 115 may contain a semiconductor material. In this case, examples of a combination of the first and second electrodes 211 through 291, 212 through 292, 213 through 293 and 115 may include, but is not limited to, Ti-doped Si and TiN-doped Si.

Hereinafter, a memory system according to example embodiments and application examples thereof will be described with reference to FIGS. 12 through 14.

Figure 12:
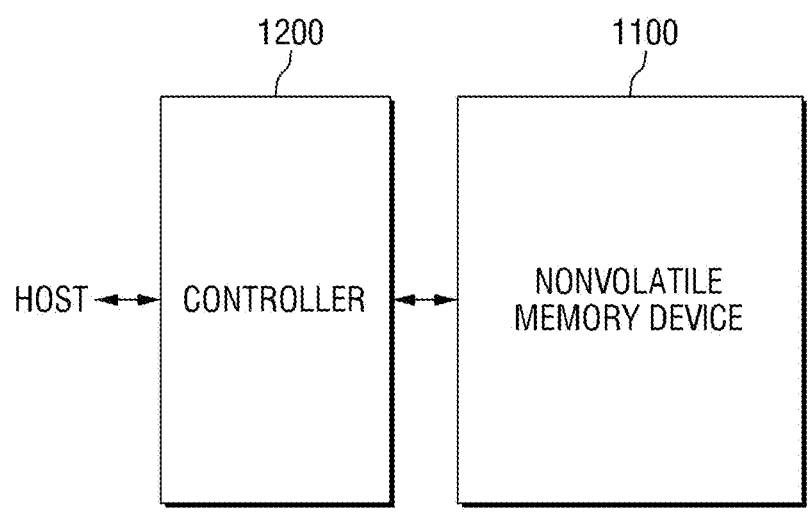
FIG. 12 is a block diagram of a memory system according to example embodiments.

FIG. 12 is a block diagram of a memory system 1000 according to example embodiments. FIG. 13 is a block diagram of an application example of the memory system 1000 shown in FIG. 12. FIG. 14 is a block diagram of a computing system 3000 including a memory system 2000 of FIG. 13.

Referring to FIG. 12, the memory system 1000 includes a nonvolatile memory device 1100 and a controller 1200.

The nonvolatile memory device 1100 may be a nonvolatile memory device which is structured as described above to operate in a reliable manner without the formation of a selection element in each nonvolatile memory cell.

The controller 1200 is connected to a host and the nonvolatile memory device 1100. The controller 1200 is configured to access the nonvolatile memory device 1100 in response to a request from the host. For example, the controller 1200 may be configured to control read/write/erase/background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 further includes components such as a random access memory (RAM), a processing unit, a host interface, and a memory interface. The RAM is used as at least one of an operation memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for data exchange between the host and the controller 1200. For example, the controller 1200 may be configured to communicate with an external device (e.g., the host) using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface may interface with the nonvolatile memory device 1100. For example, the memory interface includes a NAND interface or a NOR interface.

The memory system 1000 may further include an error correction block. The error correction block may be configured to detect and correct errors in data read from the nonvolatile memory device 1100 by using an error correction code (ECC). For example, the error correction block may be provided as a component of the controller 1200. The error correction block can also be provided as a component of the nonvolatile memory device 1100.

The controller 1200 and the nonvolatile memory device 1100 may be integrated into one semiconductor device. As an example, the controller 1200 and the nonvolatile memory device 1100 may be integrated into one semiconductor device to comprise a memory card. For example, the controller 1200 and the nonvolatile memory device 1100 may be integrated into one semiconductor device to comprise a personal computer (PC) card (e.g., Personal Computer Memory Card International Association (PCMCIA)), a compact flash card (CF), a smart media card (SM/SMC), a memory stick, a multimedia card (e.g., MMC, RS-MMC and MMCmicro), an SD card (e.g., SD, miniSD, and microSD), or a universal flash storage (UFS).

The controller 1200 and the nonvolatile memory device 1100 may be integrated into one semiconductor device to comprise a solid state drive (SSD). The SSD includes a storage device which stores data in a semiconductor memory. When the memory system 1000 is used as an SSD, the operation speed of the host connected to the memory system 1000 may increase significantly.

As another example, the memory system 1000 may be applicable to computers, ultra-mobile PCs (UMPCs), workstations, net-books, personal digital assistants (PDAs), portable computers, web tablets, wireless phones, mobile phones, smart phones, e-books, portable multimedia players (PMPs), portable game devices, navigation devices, black boxes, digital cameras, three-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, a radio frequency identification (RFID) device, and one of various components constituting a computing system.

As another example, the nonvolatile memory device 1100 or the memory system 1100 may be mounted in various types of packages. Examples of packages that may include the nonvolatile memory device 1100 or the memory system 1000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

Figure 13:
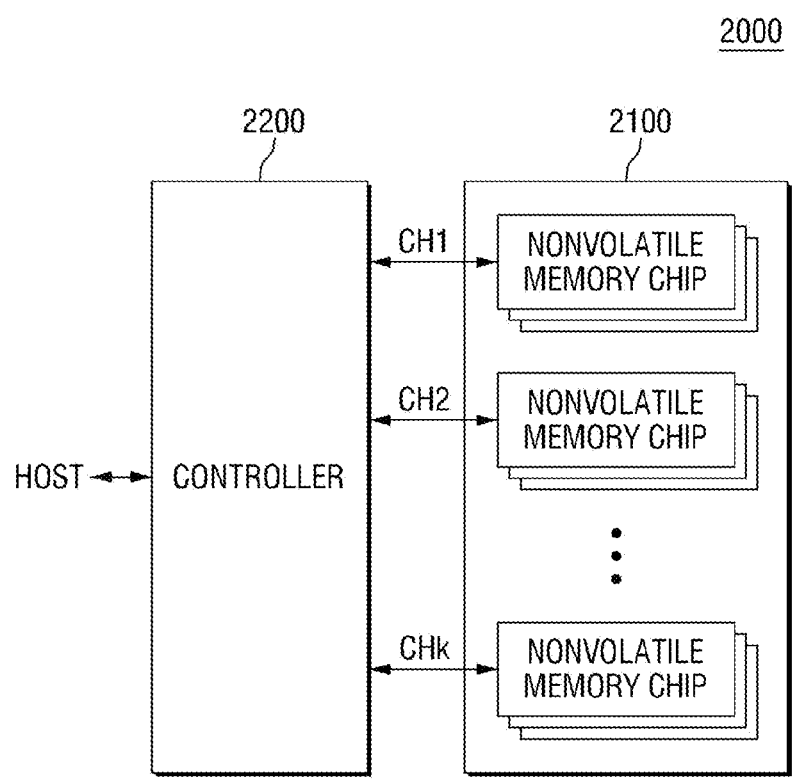
FIG. 13 is a block diagram of an application example of the memory system shown in FIG. 12.

Referring to FIG. 13, the memory system 2000 includes a nonvolatile memory device 2100 and a controller 2200. The nonvolatile memory device 2100 includes a plurality of nonvolatile memory chips. The nonvolatile memory chips form multiple memory chip groups. Each of the memory chip groups has a common channel for communication with the controller 2200. For example, it is illustrated in FIG. 13 that the nonvolatile memory chips communicate with the controller 2200 through first through kth channels CH1 through CHk.

In FIG. 13, a plurality of nonvolatile memory chips are connected to one channel. However, the memory system 2000 can be modified such that one nonvolatile memory chip is connected to one channel.

Figure 14:
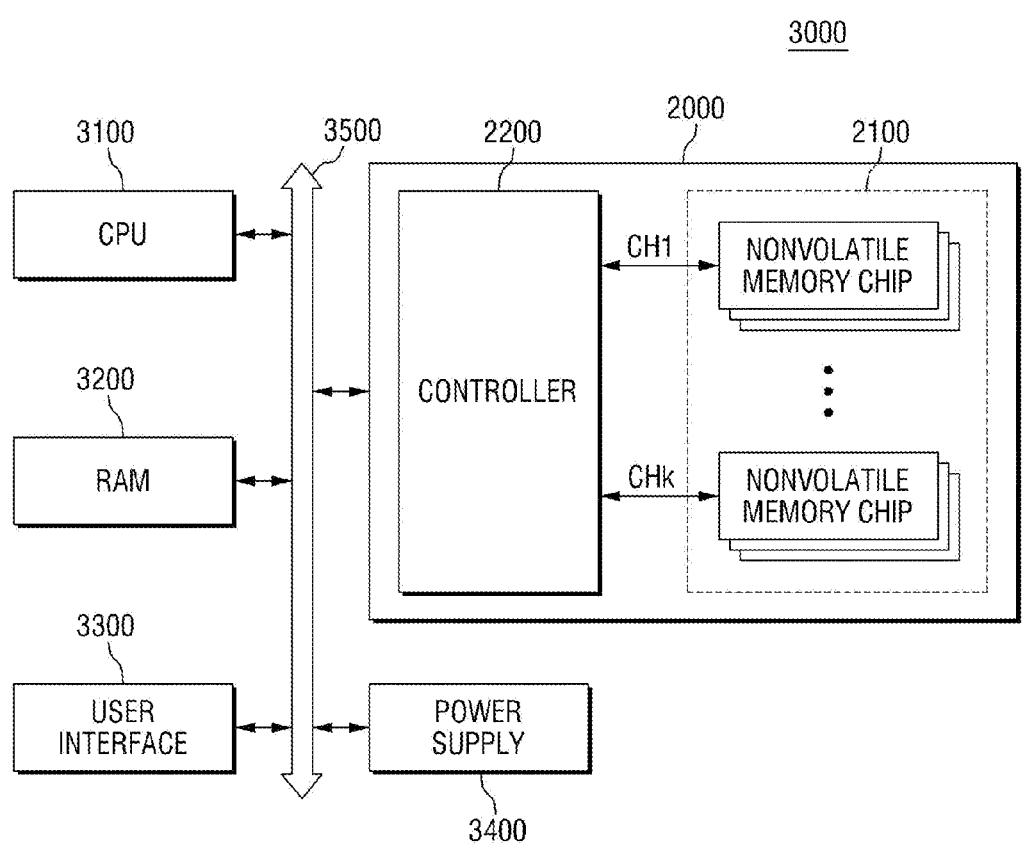
FIG. 14 is a block diagram of a computing system including a memory system of FIG. 13.

Referring to FIG. 14, the computing system 3000 includes a central processing unit (CPU) 3100, a RAM 3200, a user interface 3300, a power supply 3400, and a memory system 2000.

The memory system 2000 is electrically connected through a system bus 3500 to the CPU 3100, the RAM 3200, the user interface 3300, and the power supply 3400. Data, which are provided through the user interface 3300 or processed by the CPU 3100, are stored in the memory system 2000.

In FIG. 14, the nonvolatile memory device 2100 is connected to the system bus 3500 through the controller 2200. However, the nonvolatile memory device 2100 can also be connected directly to the system bus 3500.

In FIG. 14, the memory system 2000 described above with reference to FIG. 13 is provided. However, the memory system 2000 can be replaced by the memory system 1000 described above with reference to FIG. 12.

The computing system 3000 can also include all of the memory systems 1000 and 2000 described above with reference to FIGS. 12 and 13.

While some example embodiments have been particularly shown and described, it will be understood by one of ordinary skill in the art that variations in form and detail may be made therein without departing from the spirit and scope of the claims.

What is claimed is:
1. A nonvolatile memory cell comprising:
   a first electrode and a second electrode;
   a resistance change film between the first electrode and the second electrode, the resistance change film containing oxygen ions; and
   a first barrier film between the second electrode and the resistance change film,
   a second barrier film between the first electrode and the resistance change film, the first barrier film configured to reduce the outflow of the oxygen ions from the resistance change film, the second barrier film configured to reduce the outflow of the oxygen ions from the resistance change film, wherein a material of the first barrier film is different than a material of the second barrier film, the resistance change film is configured to be maintained in at least one of a low-resistance state and a high-resistance state when a voltage corresponding to a read level is applied to the first and second electrodes, in the low-resistance state, a current flowing through the resistance change film changes by a first amount according to a change in the voltage applied to the first and second electrodes, and in the high-resistance state, the current flowing through the resistance change film changes by a second amount, which is smaller than the first amount, according to the change in the voltage applied to the first and second electrodes, and the resistance change film is configured to be maintained in an inhibit state when a voltage corresponding to an inhibit level is applied to the first and second electrodes, in the inhibit state, the current flowing through the resistance change film changes by a third amount, which is smaller than the second amount, according to the change in the voltage applied to the first and second electrodes, and a magnitude of the inhibit level is different than a magnitude of the read level.

2. The nonvolatile memory cell of claim 1, wherein the first barrier film and the second barrier film each independently include one of a silicidated high-K dielectric and a nitridated high-K dielectric.

3. The nonvolatile memory cell of claim 1, wherein the second electrode penetrates a hole defined in the first electrode.

4. The nonvolatile memory cell of claim 3, wherein the first barrier film penetrates the hole defined in the first electrode, and the first barrier film surrounds the second electrode.

5. The nonvolatile memory cell of claim 3, wherein the second barrier film penetrates the hole defined in the first electrode, and the second barrier film surrounds the resistance change film.

6. The nonvolatile memory cell of claim 3, wherein the second barrier film covers a top surface, a side surface, and a bottom surface of the first electrode.

7. The nonvolatile memory cell of claim 3, wherein a vertical thickness of the second barrier film is different than a vertical thickness of the first electrode.

8. A nonvolatile memory cell comprising:
a first electrode and a second electrode;
a resistance change film between the first electrode and the second electrode, the resistance change film containing oxygen ions; and
a first barrier film between the second electrode and the resistance change film,
a second barrier film between the first electrode and the resistance change film,
the first barrier film configured to reduce the outflow of the oxygen ions from the resistance change film,
the second barrier film configured to reduce the outflow of the oxygen ions from the resistance change film,
the first barrier film being a high-k dielectric and the second barrier film being a different high-k dielectric,
wherein a material of the first barrier film is different than a material of the second barrier film, and the second electrode penetrates a hole defined in the first electrode.

9. The nonvolatile memory cell of claim 8, wherein
the first barrier film penetrates the hole defined in the first electrode, and the first barrier film surrounds the second electrode.

10. The nonvolatile memory cell of claim 9, wherein
the resistance change film penetrates the hole defined in the first electrode, and
the resistance change film surrounds the first barrier film.

11. The nonvolatile memory cell of claim 9, wherein
the second barrier film penetrates the hole defined in the first electrode, and
the second barrier film surrounds the resistance change film.

12. The nonvolatile memory cell of claim 8, wherein
the second barrier film covers a top surface, a side surface, and a bottom surface of the first electrode.

13. The nonvolatile memory cell of claim 8, wherein
a vertical thickness of the second barrier film is different than a vertical thickness of the first electrode.

14. A nonvolatile memory cell comprising:
a first electrode and a second electrode;
a resistance change film between the first electrode and the second electrode, the resistance change film containing oxygen ions; and
a first barrier film between the second electrode and the resistance change film,
a second barrier film between the first electrode and the resistance change film,
the first barrier film configured to reduce the outflow of the oxygen ions from the resistance change film,
the second barrier film configured to reduce the outflow of the oxygen ions from the resistance change film,
the first barrier film being a high-k dielectric and the second barrier film being a different high-k dielectric,
wherein a material of the first barrier film is different than a material of the second barrier film, and
the resistance change film is configured to be maintained in at least one of a low-resistance state and a high-resistance state when a voltage corresponding to a read level is applied to the first and second electrodes,
in the low-resistance state, a current flowing through the resistance change film changes by a first amount according to a change in the voltage applied to the first and second electrodes, and
in the high-resistance state, the current flowing through the resistance change film changes by a second amount, which is smaller than the first amount, according to the change in the voltage applied to the first and second electrodes, and
the resistance change film is configured to be maintained in an inhibit state when a voltage corresponding to an inhibit level is applied to the first and second electrodes,
in the inhibit state, the current flowing through the resistance change film changes by a third amount, which is smaller than the second amount, according to the change in the voltage applied to the first and second electrodes, and
a magnitude of the inhibit level is different than a magnitude of the read level.

* * * * *